United States Patent [19]

Ando et al.

[11] Patent Number: 4,958,156
[45] Date of Patent: Sep. 18, 1990

[54] A/D CONVERTER CIRCUIT FOR VIDEO SIGNALS HAVING DIFFERENT TIME FREQUENCIES

[75] Inventors: Naotaka Ando, Saitama; Shigeto Funado, Tokyo, both of Japan

[73] Assignee: Sony Corporation, Tokyo, Japan

[21] Appl. No.: 178,025

[22] Filed: Apr. 5, 1988

[30] Foreign Application Priority Data

Apr. 9, 1987 [JP] Japan .................................. 62-37562

[51] Int. Cl.[5] ............................................. H03M 1/12
[52] U.S. Cl. .................................... 341/123; 341/155; 358/137
[58] Field of Search ................... 360/32; 341/110, 112, 341/113, 114, 115, 116, 118, 122, 123, 155; 358/13, 134, 137, 138, 140

[56] References Cited

U.S. PATENT DOCUMENTS

| 4,366,471 | 12/1982 | Kasuga | 341/110 |
| 4,496,974 | 1/1985 | Heitmann | 358/140 |
| 4,644,412 | 2/1987 | Nishimoto et al. | 360/32 |
| 4,763,207 | 8/1988 | Podolak et al. | 341/123 |

FOREIGN PATENT DOCUMENTS 200667 11/1983 Japan .................................. 358/445

Primary Examiner—William M. Shoop, Jr.
Assistant Examiner—H. L. Williams
Attorney, Agent, or Firm—Hill, Van Santen, Steadman & Simpson

[57] ABSTRACT

An A/D (analog-to-digital) converter circuit that controls a frequency characteristic of an input video signal in response to a sampling signal of a variable frequency to reduce distortions such as a folded distortion and so on caused by the A/D conversion.

7 Claims, 3 Drawing Sheets

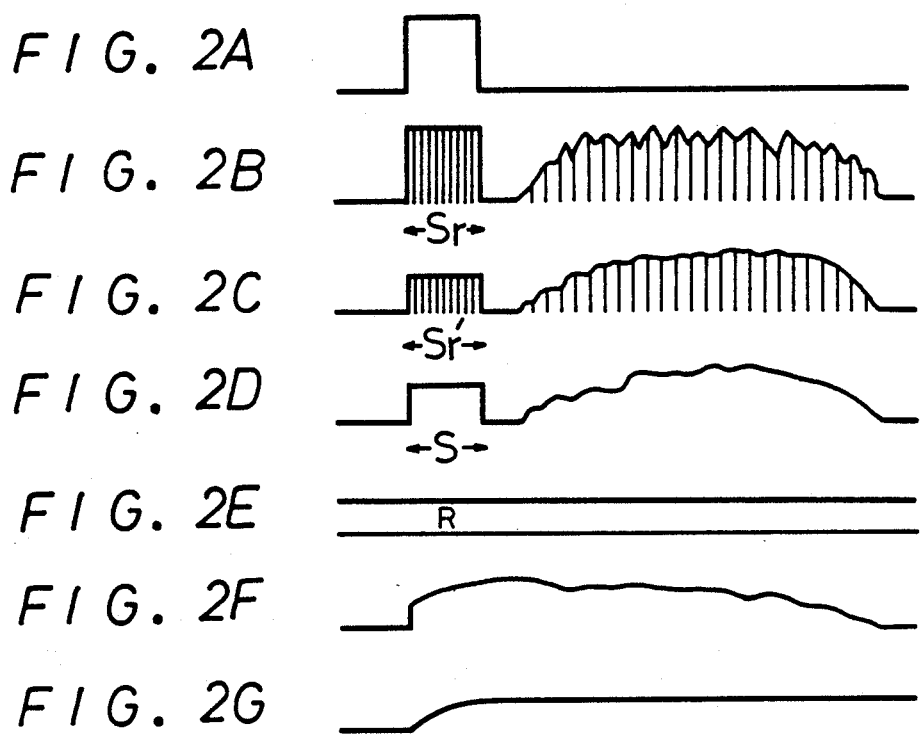
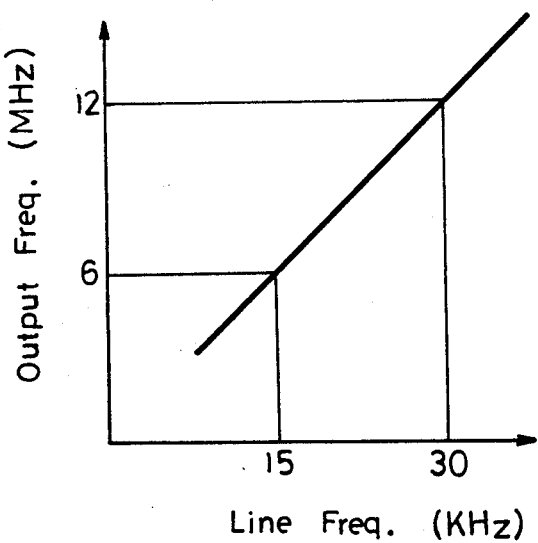

the line frequency of the incoming video signal is varied more than twice.

In accordance with the teaching of the prior art as mentioned above, when the sampling frequency of the A/D converter circuit is varied, good conversion cannot be effected.

A/D CONVERTER CIRCUIT FOR VIDEO SIGNALS HAVING DIFFERENT TIME FREQUENCIES

BACKGROUND OF THE INVENTION

1. Field of the Invention

The present invention relates generally to A/D (analog-to-digital) converter circuits and more particularly to an A/D converter circuit for a sampling signal of variable frequency.

2. Description of the Prior Art

There has been proposed so far an apparatus in which a video signal, for example, is converted into a digital signal and the digital signal is processed to effect so-called line frequency doubling. This previously-proposed apparatus is disclosed in Japanese laid-open patent application Ser. No. 61-137,481.

When such an apparatus converts, for example, a video signal in the form of analog to digital signal, if the band of a signal supplied to an A/D converter circuit is not limited to be lower than that of a half frequency signal of a sampling signal used for the A/D conversion, waveform-distortions such as a folded distortion and a sampling distortion will occur due to sampling theory, thus making it impossible to obtain an original signal of high quality.

To solve the above-mentioned problem, the following technique is known, in which a low-pass filter (LPF), referred to as a pre-filter, is provided at the preceding stage of the A/D converter circuit and a low-pass filter (LPF), referred to as a post-filter, is provided at the succeeding stage of a D/A (digital-to-analog) converter circuit and the cutoff frequencies of these low-pass filters are selected to be equal to the half frequency signal of the sampling frequency for the A/D conversion to thereby reduce the above-mentioned waveform-distortions such as a folded distortion and a sampling distortion.

In the above-mentioned conventional apparatus, in general, the sampling frequency for the A/D conversion is fixed so that the cutoff frequency of the low-pass filter might be fixed from a design standpoint. Thus, the circuits having fixed cutoff frequencies are sufficient for use.

Meanwhile, the following apparatus is proposed, in which various kinds of video signals having different line frequencies are supplied thereto and converted into digital signals, these digital signals are written in a frame memory and converted into a video signal having a desired constant line frequency such as 64 kHz for display. This previously-proposed apparatus is disclosed in our U.S. co-pending patent application Ser. No. 110,832 filed on Oct. 21, 1987. Should the sampling rate of the A/D conversion for an incoming video signal during one horizontal scanning period be made constant, the sampling frequency for the A/D conversion has to be varied as the line frequency of the incoming video signal is varied. If the cutoff frequency of the low-pass filter is fixed as earlier noted, there is a risk that the change of the sampling frequency may cause the waveform-distortions such as a folded distortion and a sampling distortion.

If the cutoff frequency of the low-pass filter is selected in consideration of the lowest sampling frequency, there is then a large risk that the quality of a reproduced picture will be deteriorated when the line frequency of the incoming video signal is high because

OBJECTS AND SUMMARY OF THE INVENTION

Accordingly, an object of the present invention is to provide an improved A/D converter circuit which can remove the defects encountered with the prior art.

Another object of the present invention is to provide an A/D converter circuit which can reduce waveform-distortions such as a folded distortion and a sampling distortion.

A further object of the present invention is to provide an A/D converter circuit which can always effect A/D conversion of good quality regardless of a sampling signal of variable frequency.

According to an aspect of the present invention, there is provided an A/D converter circuit in which an A/D converter circuit is provided to have a sampling signal of variable frequency, an input signal is supplied through a variable filter such as a voltage controlled type filter to the A/D converter circuit and the cutoff frequency of the variable filter is controlled in response to the sampling signal of variable frequency for the A/D converter circuit thereby to reduce a folded distortion caused by the A/D converter circuit.

According to the A/D converter circuit of the present invention, since the cutoff frequency of the filter is varied with the sampling signal of variable frequency, regardless of the sampling signal of variable frequency, it is possible to always effect the A/D conversion of good quality.

BRIEF DESCRIPTION OF THE DRAWINGS

A better understanding of the objects, features and advantages of the present invention can be gained from a consideration of the following detailed description of the preferred embodiment thereof, in conjunction with the figures of the accompanying drawings, wherein:

FIGS. 2A to 2G are waveform diagrams used to explain the present invention, respectively;

FIG. 3 is a characteristic diagram of a pre-filter used in the present invention.

DETAILED DESCRIPTION OF THE PREFERRED EMBODIMENT

Now, an embodiment of an A/D converter circuit according to the present invention will hereinafter be described with reference to the drawings.

Figure 1:
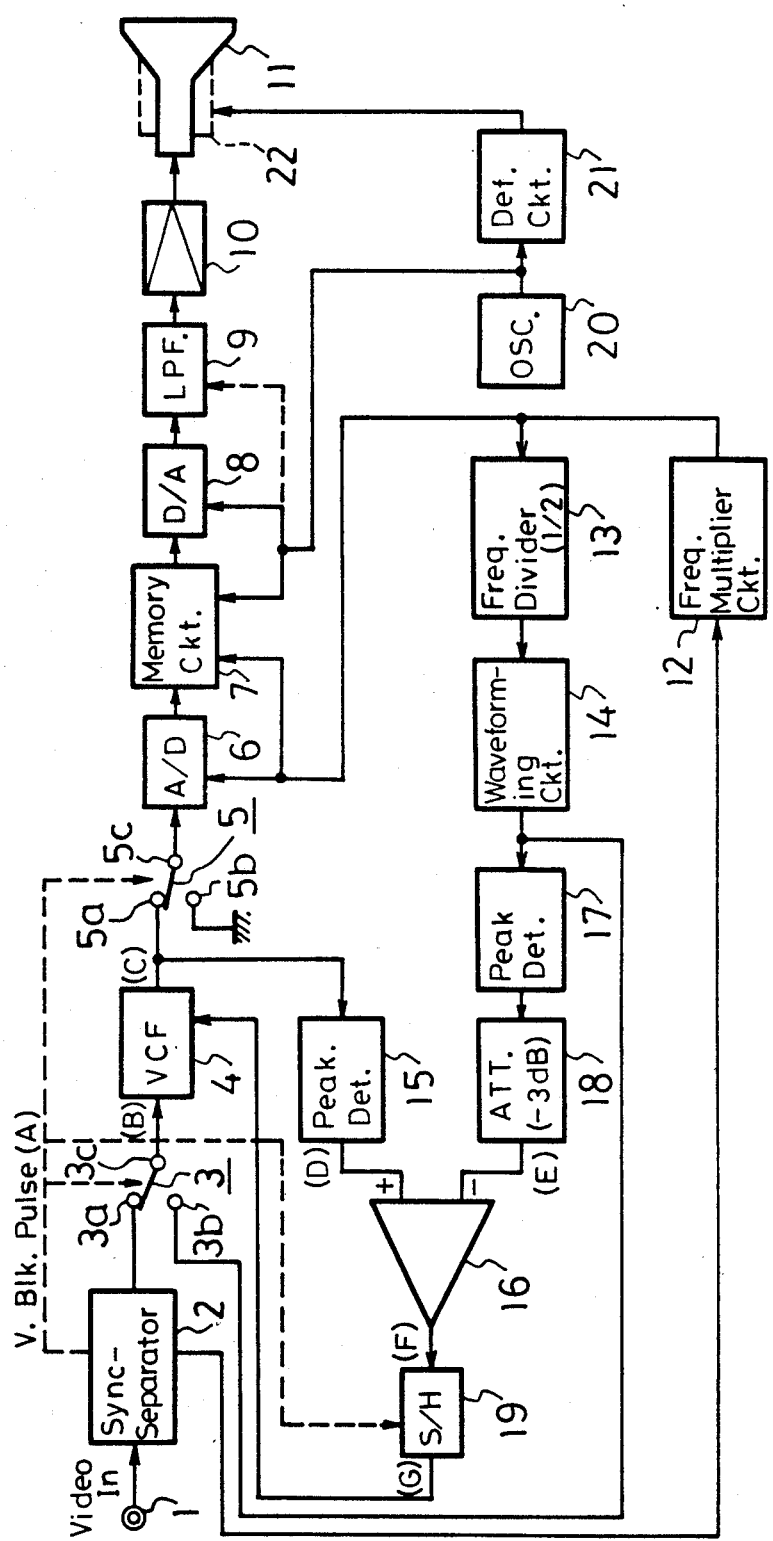
FIG. 1 is a block diagram showing an embodiment of an A/D converter circuit according to the present invention.

Referring to FIG. 1, let us explain the present invention in association with the case in which the present invention is applied to an apparatus for converting various kinds of input video signals having different line frequencies into an output video signal having a desired constant line frequency such as 64 kHz.

Referring to FIG. 1, an input video signal applied to an input terminal 1 is supplied through a sync-separator circuit 2 and one fixed contact 3a of a first switch 3 and its movable contact 3c to a voltage controlled type variable filter (VCF) 4 which serves as a pre-filter. The signal from the voltage controlled type variable filter 4 is supplied through one fixed contact 5a of a second switch 5 and its movable contact 5c to an A/D converter circuit 6. The thus converted digital signal from the A/D converter circuit 6 is supplied to a memory circuit 7, in which it is line-frequency converted. The output signal from the memory circuit 7 is supplied to a D/A converter circuit 8. The thus converted analog signal from the D/A converter circuit 8 is supplied through a low-pass filter 9, which serves as a post-filter, and a drive-amplifier 10 to a cathode ray tube 11.

Meanwhile, the horizontal synchronizing pulse separated by the sync-separator circuit 2 is supplied to a frequency multiplier circuit 12 which derives a clock signal having frequency ($f_H \times N$) where H is the line frequency and N is the sampling rate in one horizontal scanning period. This clock signal is supplied as a sampling signal to the A/D converter circuit 6 and the memory circuit 7. By way of example, when the line frequency of the input video signal is 15 kHz, the frequency of the clock signal becomes 12 MHz, and when the line frequency of the input video signal is 30 kHz, the frequency of the clock signal becomes 24 MHz.

Further, the clock signal is supplied to a ½ frequency divider circuit 13 and the output therefrom is utilized to control the cutoff frequency of the pre-filter (VCF) 4 in response to the sampling frequency of the A/D converter circuit 6, as will be described later. Specifically, the frequency-divided output from the frequency divider circuit 13 is a binary signal of, for example, 0 and 5 Volts. This output signal is supplied to a waveforming circuit 14 which derives a sine-wave signal of, for example, $1V_{p-p}$. The sine-wave signal from the waveforming circuit 14 is supplied through the other fixed contact 3b of the first switch 3 and its movable contact 3c to the voltage controlled type variable filter 4.

The output signal from the voltage controlled type variable filter 4 is supplied through a first peak detector circuit 15 to one input terminal of a differential amplifier 16. The other fixed contact 5b of the second switch 5 is grounded. Further, the output signal from the waveforming circuit 14 is supplied through a second peak detector circuit 17 to an attenuator 18. The attenuation level of this attenuator 18 is selected to be 3dB which corresponds to the level down at the cutoff frequency of the filter output. The output signal from the attenuator 18 is supplied to the other input terminal of the differential amplifier 16. The output signal from the differential amplifier 16 is supplied through a sample-hold circuit (S/H) 19 to the control terminal of the voltage controlled type variable filter 4.

In response to the vertical blanking pulse from the sync-separator circuit 2, the switches 3 and 5 connect their movable contacts 3c and 5c to the second fixed terminals 3b and 5b to drive the sample-hold circuit 19. The pulse width of the vertical blanking pulse is selected, by way of example, to be 10 to 13H where H is one horizontal scanning period.

There is provided a clock oscillator (OSC) 20 which oscillates at the above-mentioned constant line frequency (e.g.,64 kHz). The oscillation signal from the clock oscillator 20 is supplied to the memory circuit 7 and the D/A converter circuit 8 and is also supplied to a deflection circuit 21. Then, the deflection current from the deflection circuit 21 is supplied to a deflection coil 22 in the cathode ray tube 11.

In the thus made arrangement, if the vertical blanking pulse shown in FIG. 2A is delivered from the sync-separator circuit 2 and the first switch 3 is changed in position in response to this vertical blanking pulse, the voltage controlled type variable filter 4 is supplied with a reference signal Sr from the waveforming circuit 14 through the first switch 3. FIG. 2B shows the waveform of the reference signal Sr. The frequency of the reference signal Sr inserted during the vertical blanking period becomes half of the frequency of the sampling signal for the A/D converter circuit 6. Thus, the reference signal from the voltage controlled type variable filter 4 is represented as shown by Sr' in FIG. 2C. When the cutoff frequency of the voltage controlled type variable filter 4 is half of the frequency of the sampling signal, it should be noted that the level of the signal Sr' is attenuated by 3dB as compared with that of the signal Sr. The reference signal Sr' is supplied to and peak-detected by the first peak detector circuit 15 and an output signal S (shown in FIG. 2D) from the first peak detector circuit 15 is supplied to the differential amplifier 16.

The signal from the waveforming circuit 14 is peak-detected by the second peak detector circuit 17 and is then attenuated in level by 3dB by the attenuator circuit 18 thereby produced as a signal R of which the waveform is shown in FIG. 2E. This signal R is supplied to the differential amplifier 16 which therefore derives an output signal of which the waveform is illustrated in FIG. 2F. The output signal from the differential amplifier 16 is sampled and held by the sample-hold circuit 19 during the vertical blanking period, thus a control signal shown in FIG. 2G being produced by the sample-hold circuit 19.

According to this arrangement, the voltage controlled type variable filter 4 is controlled so as to attenuate the half frequency signal of the sampling signal by 3dB. Thus, when the cutoff frequency of the voltage controlled type variable filter 4 is deviated, the feedback control operation is effected in such a fashion that when the control signal of the voltage controlled type variable filter 4 is varied, the attenuation amount of the filter 4 becomes 3dB. Consequently, as shown in the characteristic diagram forming FIG. 3, the control operation of good linearity can be effected in such a fashion that when the line frequency of the input video signal is, for example, 15 kHz, the cutoff frequency of the voltage controlled type variable filter (pre-filter) 4 becomes 6 MHz, while when the line frequency of the input video signal is 30 kHz, the cutoff frequency of the voltage controlled type variable filter 4 becomes 12 MHz, respectively.

In this way, the signal from the pre-filter (voltage controlled type variable filter 4) is A/D-converted by the A/D converter circuit 6. According to the above-mentioned arrangement, since the cutoff frequency of the voltage controlled type variable filter 4 is varied with the frequency of the sampling signal, the A/D conversion of good quality can always be effected regardless of the sampling signal of variable frequency.

Thus, the A/D converter circuit of the invention is very suitable, for example, for A/D-converting input video signals having different line frequencies under the condition that the sampling rate of one horizontal scanning period is made constant.

While in the A/D converter circuit of this embodiment the line frequency of the output video signal from the memory circuit 7 is made constant, the line frequency of the output video signal may be varied in a wide range. In this case, also the sampling frequency of the D/A converter circuit 8 has to be varied. From the foregoing description, it is thus apparent that the arrangement of the low-pass filter 9 may be made the same as that of the voltage controlled type variable filter 4 so as to be controlled in response to the sampling signal as shown by a phantom in FIG. 1.

Figure 4A:
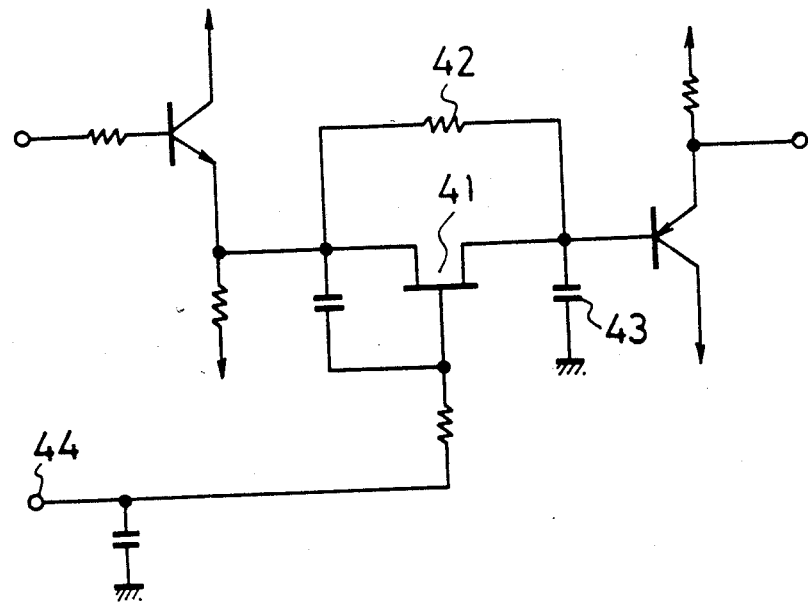
FIGS. 4A and 4B are circuit diagrams showing concrete examples of pre-filters used in the present invention, respectively.
Figure 4B:
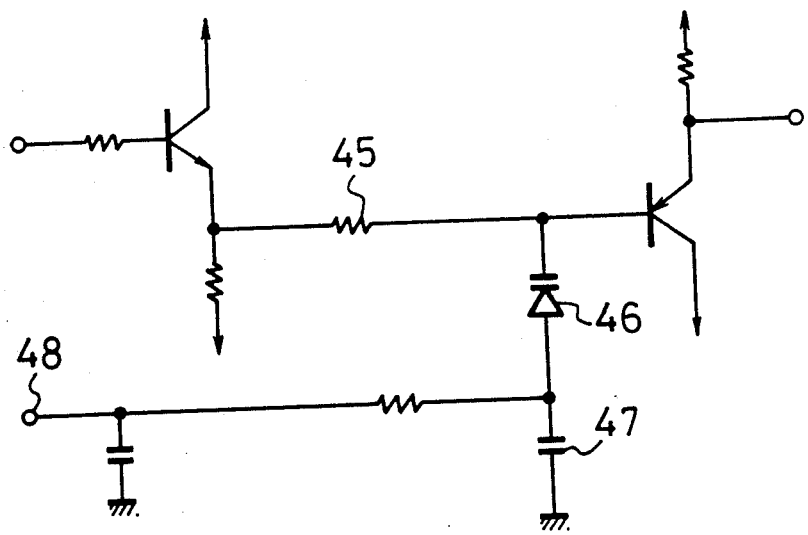

In the A/D converter circuit of the invention, the voltage controlled type variable filter 4 may be arranged as, for example, shown in FIGS. 4A and 4B in concrete.

FIG. 4A illustrates the practical arrangement of the voltage controlled type variable filter 4 which utilizes an FET (field effect transistor). As FIG. 4A shows, the low-pass filter is formed of an FET 41, a resistor 42 and a capacitor 43. The control voltage is applied through a terminal 44 to the gate of the FET 41 to vary the cutoff frequency of the low-pass filter. FIG. 4B illustrates another example of the low-pass filter which utilizes a variable-capacitance diode. As FIG. 4B shows, the low-pass filter comprises a resistor 45, a diode 46 and a capacitor 47, wherein the control voltage is applied through a terminal 48 to the diode 46 to vary the cutoff frequency of the low-pass filter.

According to the present invention, as set forth above, since the cutoff frequency of the pre-filter is varied with the sampling frequency of the A/D converter circuit, the A/D conversion of good quality can always be effected independently of the sampling signal of variable frequency.

It should be understood that the above description is presented by way of example on a single preferred embodiment of the present invention and it will be apparent that many modifications and variations thereof could be effected by one with ordinary skill in the art without departing from the spirit and scope of the novel concepts of the invention so that the scope of the invention should be determined only by the appended claims.

We claim as our invention:

1. An A/D converter circuit comprising:
   (a) an input terminal supplied with an input video signal;
   (b) a variable filter connected to said input terminal;
   (c) A/D converting means connected to said variable filter;
   (d) sampling frequency generating means for supplying a sampling signal of a variable frequency to said A/D converting means;
   (e) control means for controlling the cutoff frequency of said variable filter in response to the frequency of said sampling signal;
   (f) dividing means for producing a divided-frequency signal of said sampling signal;
   (g) first switching means connected between said input terminal and said variable filter, said first switching means supplying said divided-frequency signal and said sampling signal to said variable filter during a blanking period of said video signal; and
   (h) level comparing means for comparing the levels of the divided-frequency signal and the output signal from said variable filter during said blanking period, said control means being responsive to the output signal of said level comparing means for controlling the cutoff frequency of said variable filter.

2. A/D converter circuit according to claim 1, further comprising:
   second switching means connected between said variable filter and said A/D converting means, said second switching means disconnecting the output of said variable filter during said blanking period.

3. A/D converter circuit according to claim 1, wherein said blanking period is a vertical blanking period of the video signal.

4. A/D converter circuit according to claim 3, wherein said divided-frequency signal is a half frequency signal of said sampling signal.

5. A/D converter circuit comprising:
   (a) an input terminal supplied with an input video signal having a variable line frequency;
   (b) a variable filter;
   (c) A/D converting means connected to said variable filter;
   (d) a sync-separator connected to said input terminal;
   (e) sampling-frequency generating means for supplying a sampling signal of a variable frequency to said A/D converting means, said sampling frequency generating means having a frequency multiplier connected to said sync-separator;
   (f) a frequency divider connected to said sampling frequency generating means;
   (g) reference level forming means connected to said frequency divider;
   (h) means for supplying the output signal of said frequency divider to said variable filter during a vertical blanking period of said input video signal;
   (i) a level detector connected to the output of said variable filter;
   (j) a level comparator for comparing the level from said level detector with said reference level during said vertical blanking period; and
   (k) control means connected to said level comparator for controlling the cutoff frequency of said variable filter.

6. A/D converter circuit according to claim 5, wherein a dividing ratio of said frequency divider is 1:2.

7. A/D converter circuit according to claim 6, further comprising memory means connected to said A/D converting means for converting a line frequency of said input video signal to another fixed line frequency.

* * * * *